(12) United States Patent
Extrand et al.

(10) Patent No.: US 7,108,899 B2
(45) Date of Patent: *Sep. 19, 2006

(54) CHIP TRAY WITH TACKY SURFACE

(75) Inventors: Charles W. Extrand, Minneapolis, MN (US); Ralph Henderer, Excelsior, MN (US)

(73) Assignee: Entegris, Inc., Chaska, MN (US)

( * ) Notice: Subject to any disclaimer, the term of this patent is extended or adjusted under 35 U.S.C. 154(b) by 209 days.

This patent is subject to a terminal disclaimer.

(21) Appl. No.: 10/241,805

(22) Filed: Sep. 11, 2002

(65) Prior Publication Data

US 2004/0047108 A1 Mar. 11, 2004

(51) Int. Cl.
*B32B 5/00* (2006.01)
*B65D 85/30* (2006.01)
*B29D 22/00* (2006.01)
*H01L 23/24* (2006.01)

(52) U.S. Cl. .............. 428/34.1; 428/35.7; 206/710; 206/714; 206/722; 414/940; 414/941; 257/687

(58) Field of Classification Search .............. 428/34.1, 428/35.7, 220; 206/710, 714, 716, 722; 414/935, 940, 941; 257/678, 684–687
See application file for complete search history.

(56) References Cited

U.S. PATENT DOCUMENTS

| | | | |
|---|---|---|---|
| 4,382,024 A | 5/1983 | Seaman et al. | |
| 4,395,362 A | 7/1983 | Satoh et al. | |
| 4,395,451 A * | 7/1983 | Althouse | 428/141 |
| 4,605,574 A * | 8/1986 | Yonehara et al. | 427/424 |
| 4,667,944 A | 5/1987 | Althouse | |
| 4,711,014 A | 12/1987 | Althouse | |
| 4,746,574 A * | 5/1988 | Hattori et al. | 428/409 |
| 4,778,326 A * | 10/1988 | Althouse et al. | 414/800 |
| 4,800,126 A | 1/1989 | Leonardi | |
| 4,875,581 A * | 10/1989 | Ray et al. | 206/720 |
| 4,966,281 A | 10/1990 | Kawanishi et al. | |
| 5,075,038 A | 12/1991 | Cole et al. | |
| 5,089,314 A | 2/1992 | Masujima et al. | |
| 5,104,581 A * | 4/1992 | Ito et al. | 252/511 |
| 5,106,538 A | 4/1992 | Barma et al. | |
| 5,106,540 A | 4/1992 | Barma et al. | |
| 5,171,796 A | 12/1992 | Harris et al. | |
| 5,173,524 A | 12/1992 | Ucki et al. | |
| 5,183,969 A | 2/1993 | Odashima | |
| 5,208,103 A | 5/1993 | Miyamoto et al. | |
| 5,240,753 A | 8/1993 | Tabuchi et al. | |
| 5,304,418 A | 4/1994 | Akada et al. | |
| 5,346,765 A | 9/1994 | Maeda et al. | |
| 5,441,809 A | 8/1995 | Akhter | |

(Continued)

FOREIGN PATENT DOCUMENTS

EP 0466937 B2 3/1998

(Continued)

*Primary Examiner*—Harold Pyon
*Assistant Examiner*—Walter B. Aughenbaugh
(74) *Attorney, Agent, or Firm*—Patterson, Thuente, Skaar & Christensen, P.A.

(57) ABSTRACT

A tray for handling and retaining a plurality of components, wherein the tray has a rigid body portion and an elastomeric contact layer. The contact layer has a planar upper surface for contacting and retaining the components, and may be formed from a thermoplastic material having a surface energy between 20 dyne/cm and 100 dyne/cm, a hardness of between about Shore A15 and Shore D75, and a surface electrical resistivity of between about $1 \times 10^4$ ohms/square and $1 \times 10^{12}$ ohms/square.

45 Claims, 4 Drawing Sheets

U.S. PATENT DOCUMENTS

| | | | |
|---|---|---|---|
| 5,547,082 A * | 8/1996 | Royer et al. ............... 206/725 |
| 5,609,969 A | 3/1997 | Clatanoff et al. |
| 5,654,369 A | 8/1997 | Tsubaki et al. |
| 5,682,731 A * | 11/1997 | Althouse .................... 53/471 |
| 5,685,885 A | 11/1997 | Khandros et al. |
| 5,739,193 A | 4/1998 | Walpita et al. |
| 5,769,237 A | 6/1998 | Althouse et al. |
| 5,783,294 A | 7/1998 | Hiraiwa et al. |
| 5,791,486 A | 8/1998 | Brahmbhatt |
| 5,807,507 A | 9/1998 | Hirano et al. |
| 5,833,073 A | 11/1998 | Schatz et al. |
| 5,910,560 A | 6/1999 | Nagashima et al. |
| 5,914,191 A | 6/1999 | Hanson et al. |
| 5,922,453 A | 7/1999 | Horn, III et al. |
| 6,021,904 A | 2/2000 | Kozol et al. |
| 6,096,163 A | 8/2000 | Wensel |
| 6,150,446 A | 11/2000 | Numata |
| 6,230,896 B1 | 5/2001 | Lambert |
| 6,290,274 B1 | 9/2001 | Montoya |
| 6,357,595 B1 | 3/2002 | Sembonmatsu et al. |
| 6,926,937 B1 * | 8/2005 | Extrand et al. ............ 428/35.7 |
| 2001/0032800 A1 * | 10/2001 | Numazaki et al. .......... 206/725 |
| 2002/0014465 A1 | 2/2002 | Chung |

FOREIGN PATENT DOCUMENTS

| | | |
|---|---|---|
| JP | 55 72029 | 5/1980 |
| JP | 5 32287 | 2/1993 |
| JP | 5 335787 | 12/1993 |
| JP | 7 122888 | 5/1995 |
| JP | 9 172059 | 6/1997 |
| JP | 2000 62787 A | 2/2000 |

* cited by examiner

| Substrate Materials | Contact Layer Materials |
|---|---|
| Group A (no surface treatment required) | Urethane (UR) |
| Acrylonitrile-Butadiene-Styrene (ABS) | Polybutylene Terephthalate (PBT) |
| Polycarbonate (PC) | Polyolefins (PO) |
| Urethane (UR) | Polyethylene Terephthalate (PET) |
| Polyphenylene Sulfide (PPS) | Styrenic Block Co-polymers (e.g. Kraton®) |
| Polystyrene (PS) | Styrene-Butadiene Rubber |
| Polymethyl Methacrylate (PMMA) | Nylon - Polyether Block Polyamide (PEBA) |
| Polyetherketone (PEK) | Polypropylene/Crosslinked EDPM Rubber (e.g. Santoprene®) |
| Polyetheretherketone (PEEK) | |
| Polyetherketoneketone (PEKK) | |
| Polyether Imide (PEI) | |
| Polysulfone (PS) | |
| Styrene Acrylonitrile (SAN) | |
| Group B (surface treatment or "tie layer" required) | |
| Polyethylene (PE) | |
| Polypropylene (PP) | |
| Fluoropolymers | |
| Polyolefins (PO) | |
| Nylon | |
| Polyamide (PA) | |

Figure 3

CHIP TRAY WITH TACKY SURFACE

FIELD OF THE INVENTION

This invention relates to trays for handling device, more particularly it relates to trays for handling semiconductor devices.

BACKGROUND OF THE INVENTION

Processing of semi-conductor devices involves many processing steps. The devices are sensitive to physical and electrical damage, and must be handled carefully when being transported between processing steps. In addition, robots are often used to handle the devices during processing. These robots require precise positioning of the device to allow the robot to efficiently locate and engage the device. As a result, specialized trays have been developed to facilitate transport of the devices between processing steps.

One type of previous chip tray, known as a film frame, generally has a frame portion surrounding a thin film. On the top surface of the thin film, a layer of adhesive is disposed. A plurality of devices may then be arranged at any desired locations on the adhesive, and the adhesive serves to secure the devices in place. An example of such a film frame carrier may be seen in U.S. Pat. No. 5,833,073, a copy of which is fully incorporated herein by reference.

Other tray designs have been developed wherein physical structures, in the form of pockets, are used to secure a plurality of devices on the surface of the tray. An example of a pocketed matrix tray may be seen in U.S. Pat. No. 5,481,438. Some of these matrix tray designs, such as Japanese laid open patent application JP 05-335787, also include a multi-layer adhesive material in the bottom of the pockets for securing the devices in place.

A problem with previous trays using typical adhesive materials is that such adhesives may attract contaminants in the form of particles that can damage the devices. These contaminants can be difficult to remove from the tray by washing without causing degradation of the adhesive. In addition, the adhesive itself may contain solvents or other undesirable chemicals that can contaminate the devices or the process. Also, the adhesive itself may undergo changes in response to environmental conditions, becoming either too tacky so as to interfere with the operation of the robotic device handling process, or not tacky enough so as not to properly secure the devices in place.

Prior art matrix trays having pockets or other physical structures to retain the device may also present problems. Devices such as bare or leadless chips are not easily captured in a physical structure due to the lack of projections on the device. Also, the devices may become dislodged from the physical restraints during handling, leading to device damage or improper positioning for handling by a robot. Moreover, the necessity of forming additional structures on the tray surface leads to increased tray cost.

Thus, there is still a need for an improved tray for handling semiconductor devices.

SUMMARY OF THE INVENTION

The present invention is a chip tray for handling and retaining a plurality of components wherein the components are retained by adhesion between a surface of the components and a planar contact layer of the tray. The contact layer is formed from a relatively soft thermoplastic elastomer material having a moderate to high surface energy and that may have a surface electrical resistivity of between about $1 \times 10^4$ ohms/square and $1 \times 10^{12}$ ohms/square for purposes of electrostatic discharge (ESD) safety. The component is retained in place by adhesion exclusively with the thermoplastic contact layer and without other physical retaining structures or separate adhesives. The contact layer of the tray may be injection overmolded onto the rigid tray body portion, which is preferably formed from rigid thermoplastic material. The contact layer and the rigid body portion may be held together with a polar bond formed during the injection molding process. The relative amount of adhesion provided by the contact layer may be adjusted by intermixing or alloying the thermoplastic elastomer material with impact modifying polymers or blends of other thermoplastic elastomers. In addition, the relative amount of adhesion and the electrical properties of the contact layer may be modified by intermixing or alloying the thermoplastic elastomer with inherently static dissipative or conductive polymers, inorganic filler material such as carbon fiber, carbon powder, metallic, or ceramics, or organic filler material. In addition, small depressions or projections arranged randomly or in a regular matrixical pattern may be provided in the contact layer to alter the amount of surface area, and resultant amount of adhesion, available for contact with the components to be retained.

Accordingly, the invention may be characterized in one aspect as a tray for handling and retaining a plurality of components including a rigid body portion and an elastomeric contact layer having a planar upper surface for contacting and retaining the components. The contact layer may be formed from a thermoplastic material having a surface energy between 20 dyne/cm and 100 dyne/cm and a hardness of between about Shore A15 and Shore D75. The contact layer may have a surface electrical resistivity of between about $1 \times 10^4$ ohms/square and $1 \times 10^{12}$ ohms/square. The contact layer may be formed from urethane, polybutylene terephthalate, polyolefin, polyethylene terephthalate, styrenic block co-polymer, styrene-butadiene rubber, polyether block polyamide, or polypropylene/crosslinked EDPM rubber. The body portion may be formed from acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, rigid polyethylene, polypropylene, a fluoropolymer, polyolefin, nylon, polyamide, or any other suitable rigid polymer material. The body portion may have a peripheral border region and a downwardly projecting skirt portion or other structure to facilitate stacking of multiple trays. The contact layer may be divided into a grid portion defining a plurality of individual component receiving regions on the surface.

The invention may also be characterized as a method of making a tray for handling and retaining a plurality of components. The method includes the steps of forming a rigid body portion from plastic material, and forming a component contact layer of thermoplastic elastomer on the upper surface of the body portion.

The invention may also be characterized as a method for retaining a plurality of components on the surface of a chip tray.

It is a feature and advantage of the invention that components are retained on the chip tray only by adhesion between a flat surface of the component with a thermoplastic elastomer contact layer of the tray and without any physical retaining structure or separate adhesive.

It is another feature and advantage of the invention that components are retained in place on the tray with sufficient force so that the tray can be inverted and can be subjected to normal shipping and handling shocks without the components being dislodged.

It is another feature and advantage of the invention that no lateral or vertical physical restraining structures are used to retain components in place on the tray, apart from the thermoplastic elastomer contact layer.

It is another feature and advantage of the invention that no separate adhesive substance is used on the contact layer surface to adhere the components to the contact layer, thereby reducing the amount of process contamination from solvents and other undesirable chemicals.

It is another feature and advantage of the invention that the tray contact layer and body portion may be ESD safe for the components retained.

It is another feature and advantage of the invention that the tray is more easily recyclable than known chip trays.

It is another feature and advantage of the invention is that a stack of chip trays according to the invention may be repositioned with the components retained in place, without the need for any lateral contact or constraint on the components, and without any contact with the top sides of the components.

It is yet another feature and advantage of the invention that the relative amount of the adhesive force provided by the surface may be adjusted to suit an individual application by selection or modification of the materials used or by alteration of the surface geometry of the contact layer.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 3 is a table listing the various materials that may be used for the contact layer and body of the tray;

DETAILED DESCRIPTION OF THE PREFERRED EMBODIMENTS

The accompanying Figures depict embodiments of the matrix tray of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

As used herein, the term "about" means that dimensions, sizes, tolerances, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

The present invention comprises a tray for handling semiconductor devices and other small components wherein the component has a surface area that can be placed into direct contact with a tray surface having a moderate to high surface energy. The tray is most suitable for components having no projections or leads, such as bare or leadless chips, but may also be used with devices having leads such Chip Scale Package (CSP) devices. The devices are retained on the tray without the use of a separate adhesive material, and without lateral or vertical physical restraints apart from the thermoplastic contact layer itself. In the invention, the upper surface of the tray comprises a continuous layer of relatively soft thermoplastic material having a moderate to high surface energy. The adhesion between the surface of the device and the surface of the tray retains the device during movement and normal handling of the tray while allowing the device to be easily lifted from the surface by a robotic handling apparatus. Further, the tray may be made ESD safe through the use of materials having a surface electrical resistivity of between about $1 \times 10^4$ ohms/square and $1 \times 10^{12}$ ohms/square for either or both the contact layer and the body portion.

Figure 1:
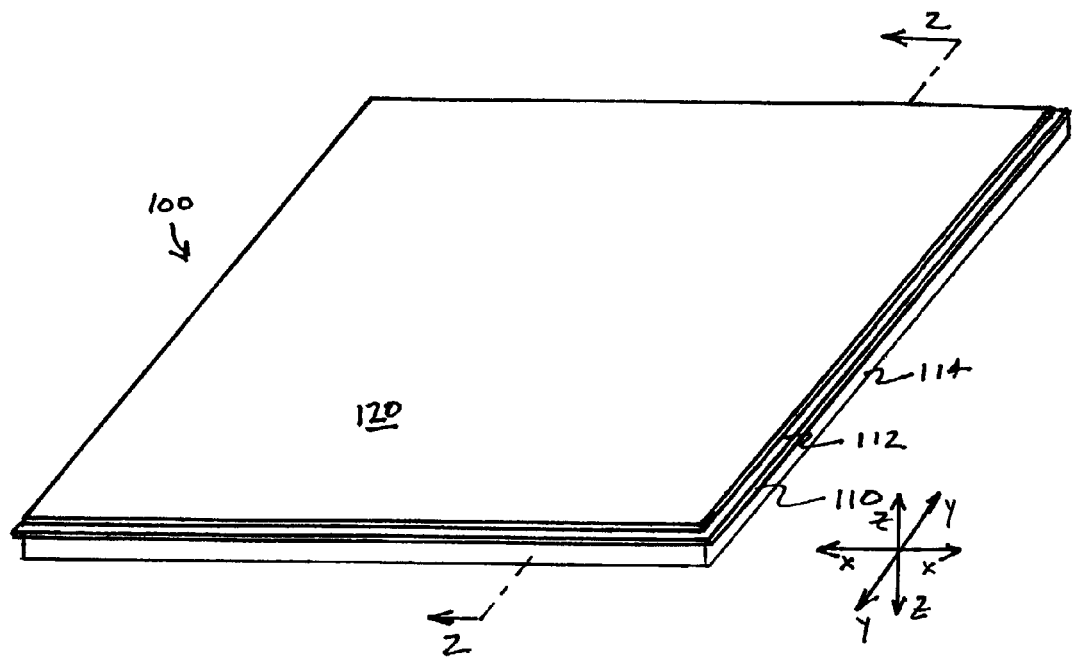
FIG. 1 is a perspective view of a preferred embodiment of the tray of the present invention.
Figure 2:
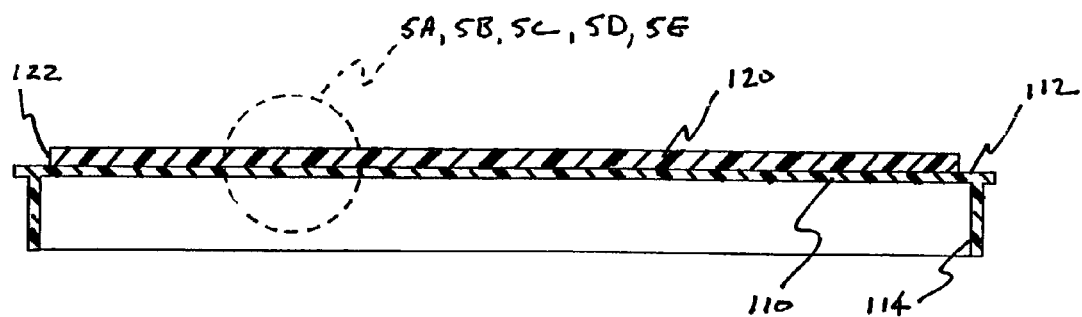
FIG. 2 is a cross section of the tray shown in FIG. 1.
Figure 4:
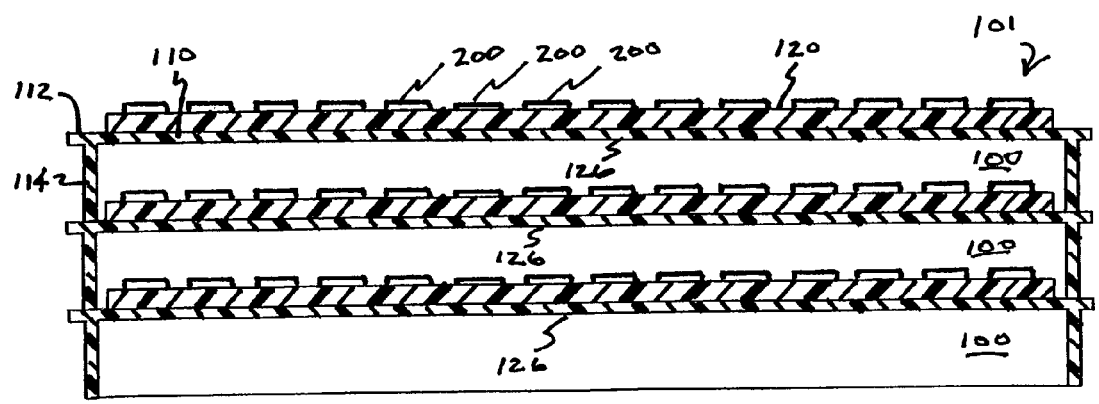
FIG. 4 is a cross sectional view of multiple trays in a stacked configuration and with small components arranged on the contact layers.

In FIGS. 1 and 2 there is shown a preferred embodiment of the device tray 100 of the present invention. Tray 100 has rigid body portion 110 oriented in a plane defined by the "x" and "y" axes as shown and having an upper surface overlain by a contact layer 120. Body portion 110 preferably has a peripheral border region 112 projecting laterally outward beyond the edge 122 of contact layer 120. A downwardly projecting skirt 114 may be provided on body portion 110. The skirt 114 is positioned so as to engage the peripheral border region 112 of a tray located immediately below when multiple trays are stacked as shown in FIG. 4. As an alternative to skirt 114, other structures such as downwardly projecting legs or posts may be used to facilitate stacking of multiple trays. Skirt 114 is of sufficient length so that any components 200 disposed on contact layer 120 do not contact any portion of a tray stacked immediately above.

According to the invention, contact layer 120 is formed from a polymeric elastomer material having a moderate to high surface energy, a relatively soft surface, and that may be ESD safe. Although other polymers can be used, thermoplastics offer the general advantages of easier recyclability, greater purity with a smaller process contamination causing sol-fraction, and lower cost, and are hence preferred. Currently the preferred materials for contact layer 120 are relatively soft thermoplastic elastomers, including, for example, elastomeric variants of urethane (UR), polybutylene terephthalate (PBT), polyolefins (PO), polyethylene terephthalate (PET), styrenic block co-polymers (e.g. Kraton®), styrene-butadiene rubber, and nylon in the form of polyether block polyamide (PEBA). As an alternative, a thermoplastic vulcanizate material, such as polypropylene/crosslinked EDPM rubber, for example Santoprene® made by Advanced Elastomer Systems of Akron, Ohio, may be also used. The surface energy of the material is preferably 20 dyne/centimeter to 100 dyne/centimeter, more preferably between about 30 dyne/centimeter to 45 dyne/centimeter, and most preferably about 40 dyne/centimeter. The material preferably has a durometer hardness value of less than about Shore D75, and more than about Shore A15.

It is preferred that contact layer 120 be ESD safe, having a surface electrical resistivity value of between about $1\times10^4$ ohms/square and $1\times10^{12}$ ohms/square. Inherently static dissipative polymers may be intermixed or alloyed with the contact layer material to achieve the desired surface electrical resistivity. Also, an inherently conductive polymer, such as doped polyaniline, polypyrrole, polythiophene, polyisothianaphthene, polyparaphenylene, polyparaphenylene vinylene, polyheptadiyne, or polyacetylene may be used as an alloying polymer. As an alternative, carbon fiber, carbon powder, metallic particulate, ceramic particulate, or other electrically conductive fillers may be added to the material. Organic filler materials may also be used to alter the surface resistivity of the material, such as for example, quaternary ammonium salts, sulfonium salts, alkyl sulfonates, alkyl sulfates, alkyl phosphates, ethanol amides, ethanol amines, or fatty amines. Of course any other method or material may be used for the purpose which provides the requisite electrical properties along with the desired physical properties of surface energy, relative hardness and purity.

The amount of adhesion provided by contact layer 120 may be adjusted for particular applications wherein components with specific physical characteristics are to be retained. This adjustment may be accomplished by selecting or altering the material used for contact layer 120, or through alterations to the geometry and dimensions of the surface itself. Generally, for example, the materials having surface energies at the higher end of the ranges will be more strongly retentive of components than materials at the lower end of the ranges. Also, materials with hardness values at the softer end of the range will typically be more strongly retentive of components than will the harder materials. Any of the alloying or filler materials discussed above may also be intermixed or alloyed with the base material for the purpose of altering the surface energy or relative hardness of the base material. The desired relative hardness properties may also be achieved using impact modifying polymers or blends of other thermoplastic elastomers as alloying agents. Generally, it is desired that surface layer 120 provide a degree of adhesion to a component per unit of component area at least greater than the corresponding gravitational force per unit area of the component, thus permitting retention of the component even when the tray is inverted. It is most preferred that the amount of adhesion be sufficient to retain the components under shock and vibration loads typically encountered during shipping and handling operations.

The amount of adhesion may also be reduced by selectively altering the geometry and resulting amount of available component contact area of contact layer 120. This may be accomplished by forming a multiplicity of regular depressions 180 or projections 182 in contact layer 120 as shown in greatly exaggerated fashion for clarity in FIG. 5C or 5D, respectively. The depressions 180 or projections 182 may be arranged randomly or in a regular matrix pattern on contact layer 120. The depressions 180 or projections 182 may be from about 0.000040 inch to 0.10 inch in depth or height respectively, and spaced from about 0.000040 inch to about 0.30 inch apart, as may be needed to achieve the desired amount of adhesion. The features may be formed on contact layer 120 by stamping with a mold machined with a negative impression of the desired features. Generally, the mold may be machined using known machining techniques. Photolithography may be used to machine the mold to form regular features at the smaller ends of the ranges. As an alternative, a mold having a fine, random distribution of features may be made by sandblasting, glass beading, or shotpeening the mold surface.

Figure 5A:
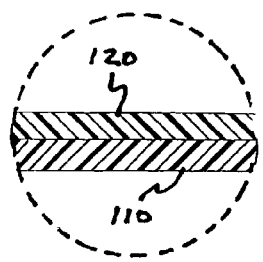
FIG. 5A is an enlarged view of a portion of the view of FIG. 2.
Figure 5B:
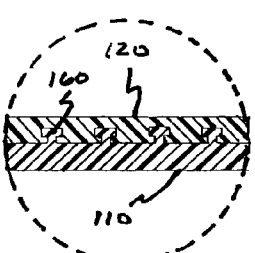
FIG. 5B is an alternative enlarged view of a portion of the view of FIG. 2.
Figure 5E:
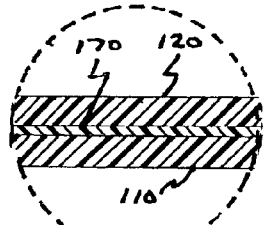
FIG. 5E is still another alternative enlarged view of a portion of the view of FIG. 2.
Figure 5C:
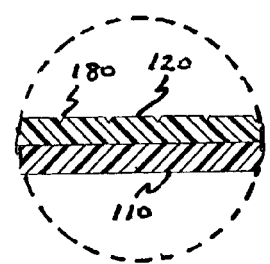
FIG. 5C is another alternative enlarged view of a portion of the view of FIG. 2.
Figure 5D:
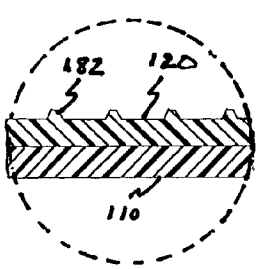
FIG. 5D is yet another alternative enlarged view of a portion of the view of FIG. 2.

It is currently most preferred that surface layer 120 be injection overmolded in a continuous layer onto body portion 110 as shown best in FIGS. 2 and 5A, using standard injection molding techniques. The two layers may also be mechanically fastened together, or may be secured by a combination of methods. Preferably, the materials for surface layer 120 and body portion 110 are selected so that a polar bond is formed during the injection molding process. In addition, mechanical bonding structures 160, as shown best in FIG. 5B, may be provided on body portion 110 to enhance bonding efficacy. In addition, an intermediate or tie layer 170 may be used between the two materials to enhance bonding effectiveness as shown in FIG. 5E. It is preferred that thermoplastic polymers be used for body portion 110, as well as for contact layer 120, since thermoplastics tend to offer the general advantages of easier recyclability, greater purity with a smaller process contamination causing solfraction, and lower cost. Body portion 110 may be made ESD safe using the same materials and techniques as discussed for contact layer 120. Suitable rigid thermosetting polymers may also be used for body portion 110, but are less preferred.

Body portion 110 provides rigidity and mechanical strength to the tray, and accordingly must be made from suitably rigid material and must have adequate thickness to withstand the mechanical loading anticipated during use and handling of the tray. Although any suitable polymer material having the desired qualities of rigidity, mechanical strength, and chemical compatibility may be used, some suitable polar polymer materials for body portion 110 are listed in the first column of the table found in FIG. 3. The listed "Group A" thermoplastic materials may be molded with any of the contact layer materials listed in the second column of the table without need for surface treatment of the body material, although surface treatment may be used to enhance bonding efficacy. The body materials listed in "Group B" are generally non-polar polymers, and require surface treatment in the form of corona, plasma, chemical, or flame treatment to achieve a proper polar bond with contact layer 120. As an alternative, the materials in "Group B" may be bonded using a separate intermediate tie layer of mutually compatible material, such as Bynel® made by Du Pont Corporation or Tymor® made by Nichimen Corporation.

Figure 6:
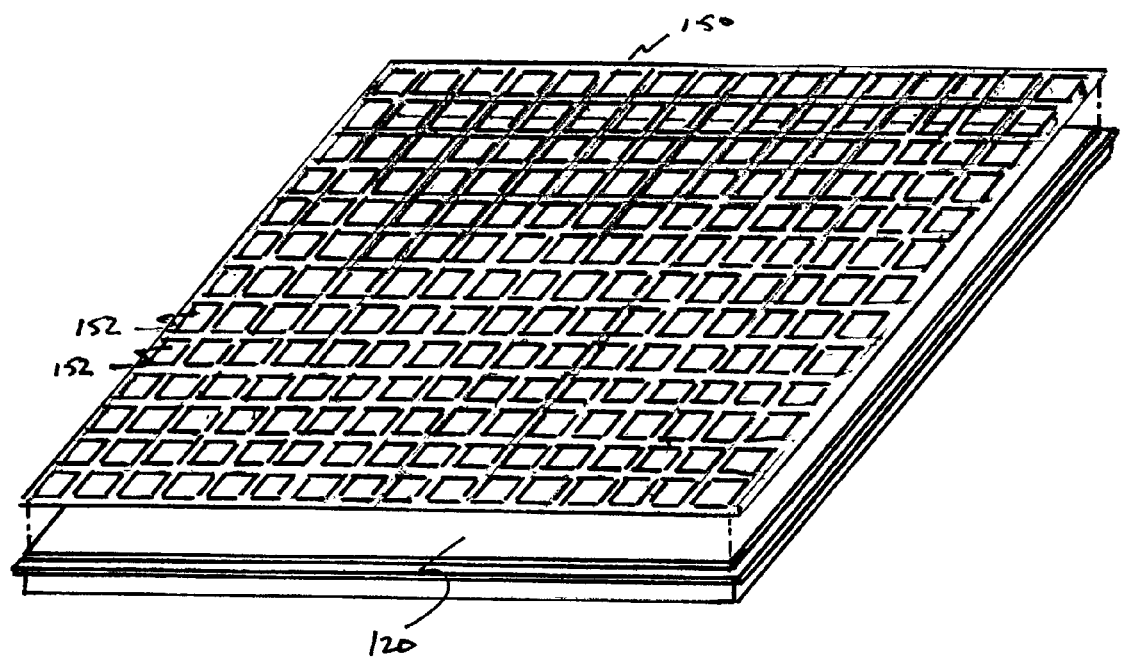
FIG. 6 is a perspective view of the tray of the present invention with a grid for defining individual component retaining regions on the surface thereof.
Figure 7:
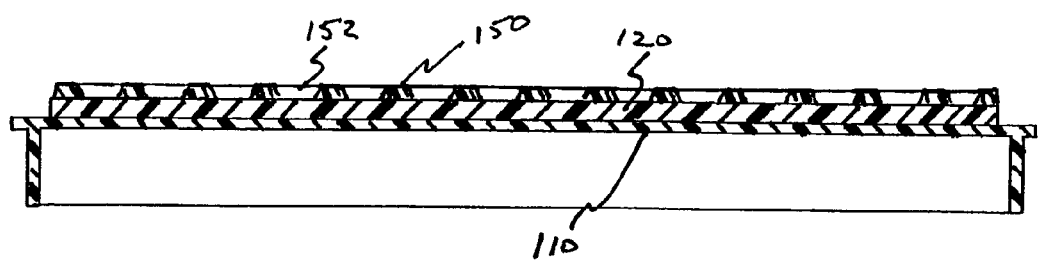
FIG. 7 is a cross section of the view of FIG. 6.

Although it is not necessary for effective retention of components, it may be desirable to define individual component retaining regions 152 on contact layer 120, as shown in FIGS. 6 and 7. A separate grid member 150 may be formed from suitable thermoplastic material and attached by any suitable method to contact layer 120 to define the component retaining regions 152. The component retaining regions 152 may also be formed directly in the surface of contact layer 120 during the molding step, or by subsequent embossing.

During use of the tray, individual components may be arranged anywhere on contact layer 120 with a significant portion of the surface area of the device in direct contact with contact layer 120. The moderate to high surface energy and relative softness of contact layer 120 results in effective retention of the component on contact layer 120 by adhesion between the thermoplastic contact surface 120 and a surface of the device, but without the need for separate adhesives or other physical retaining structures. The ESD safe static dissipative properties of the materials for the contact surface, rigid body portion or both, provide electrical protection for the devices stored therein.

The tray of the present invention is easily manufactured since the component contact layer 120 is formed in a single, monolithic piece, without the added complexity and cost of precision forming of physical retaining structures. In addition, the thermoplastic construction of the tray reduces the amount of process contamination contributed by the tray. Moreover, the thermoplastic components are more easily and completely recycled, for reduced environmental impact.

The stacking features of the invention are best seen with reference to FIG. 4. In a stack of trays 101 as depicted in FIG. 4, each component 200 is in direct contact with, and is retained by contact surface 120. When the trays 100 are stacked, downwardly projecting skirt 114 of each tray contacts and rests on peripheral border region 112 of the tray immediately below. Skirt 114 is of sufficient height so that bottom surface 126 of the tray is spaced apart from the components 200 below. Components 200 are retained in place only by adhesion with contact surface 120. The components 200 are not vertically constrained by contact with bottom surface 126 of the tray immediately above. The stack of trays 101 may be repositioned and even inverted without causing the components 200 to be dislodged, and without the need for device contact with other trays or with other portions of the same tray.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A tray for handling and retaining a plurality of small microelectronics components comprising:
  a plastic rigid body portion comprising a plurality of component containing regions; and
  an elastomeric contact layer molded onto the rigid body portion component containing regions, the elastomeric contact layer having a downwardly facing concealed surface continuously contacting the rigid body portion and a planar upper surface for contacting and retaining the components, said contact layer being formed from a thermoplastic material having a surface energy between about 20 dyne/cm and about 100 dyne/cm and a hardness of between about Shore A15 and about Shore D75 wherein said elastomeric contact layer has a surface electrical resistivity of between about $1 \times 10^4$ ohms/square and $1 \times 10^{12}$ ohms/square and has an adhesivity sufficient to keep a small microelectronics component in place on the contact layer when said tray is inverted such that the elastomeric contact surface faces downward.

2. The tray of claim 1, wherein said elastomeric contact layer is formed from a thermoplastic elastomer material.

3. The tray of claim 2, wherein said thermoplastic elastomer material is selected from the group of thermoplastic elastomers consisting of urethane, polybutylene terephthalate, polyolefin, polyethylene terephthalate, styrenic block co-polymer, styrene-butadiene rubber, and polyether block polyamide.

4. The tray of claim 2, wherein said thermoplastic elastomer material is a thermoplastic vulcanizate.

5. The tray of claim 2, wherein said thermoplastic elastomer material is alloyed with an inherently static dissipative polymer or an inherently conductive polymer.

6. The tray of claim 2, wherein said thermoplastic elastomer material contains a filler material.

7. The tray of claim 6, wherein said filler material is an inorganic, conductive material.

8. The tray of claim 7, wherein said inorganic conductive material is carbon fiber, carbon powder, metallic particulate, or ceramic particulate.

9. The tray of claim 6, wherein said filler material is an organic material.

10. The tray of claim 9, wherein said organic material is quaternary ammonium salt, sulfonium salt, alkyl sulfonate, alkyl sulfate, alkyl phosphate, ethanol amide, ethanol amine, or fatty amine.

11. The tray of claim 1, wherein said contact layer has a multiplicity of depressions or projections formed thereon for reducing the adhesiveness thereof.

12. The tray of claim 1, wherein said body portion is formed from a rigid thermoplastic material selected from the group of rigid thermoplastic materials consisting of acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, and styrene acrylonitrile.

13. The tray of claim 1, wherein said rigid body portion is formed from rigid polyethylene, polypropylene, fluoropolymer, polyolefin, polyamide, or nylon.

14. The tray of claim 1, further comprising a tie layer interposed between said body portion and said downwardly facing concealed surface.

15. The tray of claim 1, wherein said contact layer is formed from a thermoplastic material having a surface energy of between about 30 dyne/cm and about 45 dyne/cm.

16. The tray of claim 1, wherein said contact layer is formed from a thermoplastic material having a surface energy of about 40 dyne/cm.

17. The tray of claim 1, wherein said body portion has a peripheral border region and a downwardly projecting skirt portion, and wherein said skirt portion is adapted to engage the peripheral border region of a separate tray when the trays are stacked.

18. The tray of claim 1, wherein said rigid body portion has a surface electrical resistivity of from about $1 \times 10^4$ to about $1 \times 10^{12}$ ohms/square.

19. The tray of claim 1, wherein said rigid body portion is electrically conductive.

20. The tray of claim 1, further comprising a grid portion disposed on said upper surface of said contact layer, said grid portion defining a plurality of individual component receiving regions.

21. A chip tray in combination with a plurality of components to be retained thereby, comprising:
  a plurality of components, each presenting a surface; and
  a chip tray comprising:
    a rigid, generally planar, plastic body portion having an upper surface; and a contact layer of thermoplastic elastomer material having a downwardly facing concealed surface continuously molded on said upper surface for contacting and retaining the plurality of components, said contact layer having a surface energy of between about 20 dyne/centimeter to about 100 dyne/centimeter and a hardness of between about Shore A15 and about Shore D75, each component being laterally and vertically restrained in place exclusively by adhesion with said contact layer when the surface of the component is contacted with the contact layer, and wherein the adhesion is at least sufficient so that each component remains in place on the contact layer when said tray is inverted wherein said contact layer has a surface electrical resistivity of from about $1\times10^4$ to about $1\times10^{12}$ ohms/square.

22. The combination of claim 21, wherein said thermoplastic elastomer material is selected from the group consisting of urethane, polybutylene terephthalate, polyolefin, polyethylene terephthalate, styrenic block co-polymer, styrene-butadiene rubber, polyether block polyamide, and polypropylene/crosslinked EDPM rubber.

23. The combination of claim 21, wherein said thermoplastic elastomer contains a filler material.

24. The combination of claim 23, wherein said filler material is carbon fiber, carbon powder, metallic particulate, or ceramic particulate.

25. The combination of claim 23, wherein said filler material is an organic material.

26. The combination of claim 21, wherein said thermoplastic elastomer material is alloyed with an inherently static dissipative polymer or an inherently conductive polymer.

27. The combination of claim 21, wherein said contact layer has a multiplicity of depressions or projections formed thereon for reducing the adhesiveness thereof.

28. The combination of claim 21, wherein said body portion is formed from a rigid thermoplastic material selected from the group of rigid thermoplastic materials consisting of acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, and styrene acrylonitrile.

29. The combination of claim 21, wherein said rigid body portion is formed from rigid polyethylene, polypropylene, fluoropolymer, polyolefin, polyamide, or nylon.

30. The combination of claim 21, further comprising a tie layer interposed between said body portion and said contact layer.

31. The combination of claim 21, wherein said contact layer has a surface energy of between about 30 dyne/cm and about 45 dyne/cm.

32. The combination of claim 21, wherein said contact layer has a surface energy of about 40 dyne/cm.

33. The combination of claim 21, wherein said body portion has a peripheral border region and a downwardly projecting skirt portion, and wherein said skirt portion is adapted to engage the peripheral border region of a separate tray when the trays are stacked.

34. The tray of claim 21, further comprising a grid portion disposed on said contact layer, said grid portion defining a plurality of individual component receiving regions.

35. A method of making a tray for handling and retaining a plurality of small components comprising the steps of:
forming a rigid body portion from plastic material, said body portion having an upper surface; and
forming a contact layer by molding a contact layer comprising a thermoplastic elastomer on said upper surface, the thermoplastic elastomer having a surface energy of between about 20 dyne/centimeter and about 100 dyne/centimeter, a hardness of between about Shore A15 and about Shore D75, and a surface electrical resistivity of between about $1\times10^4$ to about $1\times10^{12}$ ohms/square, said contact layer having sufficient adhesion so as to retain each of the plurality of components when said tray is inverted.

36. The method of claim 35, further comprising the step of forming a plurality of mechanical bonding structures on said upper surface of said rigid body portion for mechanical binding to the molded contact layer.

37. The method of claim 35 wherein said body portion is formed from rigid polyethylene, polypropylene, or a fluoropolymer, and further comprising the step of surface treating said upper surface of said body portion with a corona, plasma, flame, or chemical treatment process.

38. The method of claim 35, further comprising the step of forming an intermediate tie layer between said body portion upper surface and said contact layer.

39. The method of claim 35, further comprising the steps of forming a grid member for defining a plurality of individual component contact regions on said contact layer and affixing said grid member to said contact layer.

40. A tray for handling and retaining a plurality of components comprising:
a rigid, generally planar, plastic body portion having an upper surface; and
means on said upper surface for retaining each of said plurality of components, said means comprising a material continuously molded to the rigid, generally planar, body portion and providing at least a sufficient retentive force to the component so that the component is retained in place exclusively by said means when said tray is inverted, wherein said means for retaining a plurality of components comprises a contact layer of thermoplastic elastomer material, said layer having a surface energy of between about 30 dynes/centimeter and about 45 dynes/centimeter, a hardness of between about Shore A15 and about Shore D75, and a surface electrical resistivity of between about $1\times10^4$ and $1\times10^{12}$ ohms/square.

41. The tray of claim 40, wherein said thermoplastic elastomer is selected from the group consisting of urethane, polybutylene terephthalate, polyolefin, polyethylene terephthalate, styrenic block co-polymer, styrene-butadiene rubber, polyether block polyamide, and polypropylene/crosslinked EDPM rubber.

42. The tray of claim 40, wherein said contact layer has a multiplicity of depressions or projections formed therein for reducing the adhesiveness thereof.

43. The tray of claim 40, wherein said body portion is formed from acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, styrene acrylonitrile, polyethylene, polypropylene, fluoropolymer, polyolefin, polyamide, or nylon.

44. A method for retaining a plurality of components on a chip tray comprising:
providing a plurality of components, each presenting a surface;
providing a chip tray comprising a rigid, thermoplastic body portion having an upper surface, and a contact layer on said upper surface, said contact layer comprising a thermoplastic elastomer having a downwardly facing concealed surface continuously molded to the upper surface, with the elastomer having a surface energy of between about 20 dyne/centimeter and about 100 dyne/centimeter, a hardness of between about Shore A15 and about Shore D75, and a surface electrical resistivity of from about $1\times10^4$ to about $1\times10^{12}$ ohms/square; and placing each of said plurality of components in contact with said contact layer, each of said plurality of components being retained in place exclusively by adhesion with said contact layer.

45. A system of stackable chip trays in combination with a plurality of components to be retained in said chip trays, the combination comprising:

a plurality of components, each presenting a surface; and a plurality of chip trays, each tray comprising:

a generally planar rigid body portion having an upper surface overlain by a contact layer in continuous contact with the upper surface, said body portion having a peripheral border region and at least one downwardly projecting structure for engaging the peripheral border region of a separate one of said plurality of trays when the trays are stacked, the contact layer being formed from a thermoplastic elastomer material and having a surface energy of between about 20 dyne/centimeter and about 100 dyne/centimeter, a hardness of between about Shore A15 and about Shore D75, and a surface electrical resistivity of from about $1\times10^4$ to about $1\times10^{12}$ ohms/square, wherein each component of said plurality is laterally and vertically restrained in place exclusively by adhesion with said contact layer when the surface of the component is contacted with said contact layer, and wherein the adhesion is sufficient so that the component remains in place on the contact layer when the tray is inverted.

* * * * *